(12) United States Patent
Lee

(10) Patent No.: US 9,083,003 B2
(45) Date of Patent: Jul. 14, 2015

(54) ORGANIC LIGHT EMITTING DIODE DISPLAY AND METHOD FOR MANUFACTURING THE SAME

(75) Inventor: Hyun-Shik Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 13/584,758

(22) Filed: Aug. 13, 2012

(65) Prior Publication Data

US 2013/0228801 A1   Sep. 5, 2013

(30) Foreign Application Priority Data

Mar. 5, 2012   (KR) .................. 10-2012-0022142

(51) Int. Cl.
| | | |
|---|---|---|
| *H01L 33/00* | (2010.01) | |
| *H01L 51/52* | (2006.01) | |
| *H01L 27/32* | (2006.01) | |

(52) U.S. Cl.
CPC ........ *H01L 51/5268* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 2006/0289872 A1* | 12/2006 | Miyazawa | ............ 257/72 |
| 2010/0048745 A1* | 2/2010 | Yamada et al. | .......... 521/61 |
| 2010/0156279 A1 | 6/2010 | Tamura et al. | |
| 2010/0238386 A1 | 9/2010 | Yin et al. | |
| 2011/0272715 A1 | 11/2011 | Kang et al. | |

FOREIGN PATENT DOCUMENTS

| | | |
|---|---|---|
| KR | 10-2006-0020830 | 3/2006 |
| KR | 10-0684834 | 2/2007 |
| KR | 10-0684835 | 2/2007 |
| KR | 10-2011-0062236 | 6/2011 |

OTHER PUBLICATIONS

Ding et al. ("Novel Macro and Meso Porous Materials Prepared form Miscible polysulfone/Polyimide Blends," Mat. Res. Soc. Symp. Proc.vol. 752, 2003).*
Korean Patent Abstracts, Publication No. 1020060060461 A, dated Jun. 5, 2006, for corresponding Korean Patent 10-0684834 listed above.

* cited by examiner

*Primary Examiner* — Yasser A Abdelaziez
(74) *Attorney, Agent, or Firm* — Christie, Parker & Hale, LLP

(57) ABSTRACT

An organic light emitting diode display includes a substrate, first electrodes patterned on the substrate, pixel defining layers on the substrate to separate the first electrodes corresponding to pixel units, light emitting layers on the first electrodes and separated corresponding to the pixel units, and a second electrode on the light emitting layers, wherein the pixel defining layers have pores.

11 Claims, 4 Drawing Sheets

ORGANIC LIGHT EMITTING DIODE DISPLAY AND METHOD FOR MANUFACTURING THE SAME

CROSS-REFERENCE TO RELATED APPLICATIONS

This application claims priority to and the benefit of Korean Patent Application No. 10-2012-0022142, filed on Mar. 5, 2012, with the Korean Intellectual Property Office, the present disclosure of which is incorporated herein in its entirety by reference.

FIELD

Embodiments of the present invention relate to an organic light emitting diode display and a method for manufacturing the same.

BACKGROUND

An organic light emitting diode (OLED) display is a self-luminous display device that is provided with organic light emitting diodes that emit light to display an image. Unlike a liquid crystal display, the organic light emitting diode display does not require a separate light source, and thus the thickness and weight thereof can be relatively reduced. Moreover, the organic light emitting diode display exhibits high quality characteristics such as low power consumption, high luminance, a high response speed, and the like, and thus is in the spotlight as a next generation display device of a portable electronic apparatus.

FIG. 1 schematically illustrates a general structure of an OLED/pixel unit of an organic light emitting diode display.

Referring to FIG. 1, a positive electrode 20 as a first electrode is formed on a substrate 10 for the organic light emitting diode display, and the positive electrode 20 is divided into pixel units using pixel defining layers (PDLs) 30. A light emitting layer 50 is formed on the positive electrode 20 and a portion of the pixel defining layers 30. A negative electrode 70 is formed as a common electrode on the light emitting layer 50 and the pixel defining layers 30.

Before forming the light emitting layer 50, at least one of a hole injection layer and a hole transporting layer may be additionally formed, and at least one of an electron transporting layer and an electron injection layer may be formed between the light emitting layer 50 and the negative electrode 70. Multiple light emitting layers 50 may be separated into a red light emitting layer, a green light emitting layer, and a blue light emitting layer.

Currently, light extraction efficiency of the light emitting diode display is approximately 20%, which is not satisfactory. In other words, only about 20% of light generated from the light emitting layer of the light emitting diode display is emitted outside through a light emitting surface, and about 80% of light generated from the light emitting layer is confined and extinguished in, or absorbed by, the structure of the organic light emitting diode display.

The extinguished light partially leaks out to the side of the light emitting layer of the organic light emitting diode display. That is, an arrow in FIG. 1 denotes that a part of light generated from the light emitting layer of the organic light emitting diode display is emitted to the side to be incident on the pixel defining layer. As shown in FIG. 1, a part of the light generated from the light emitting layer of the organic light emitting diode display is emitted to the side and is incident on the pixel defining layer, and thereafter is extinguished, whereby a part of the light cannot contribute to light emission of the organic light emitting diode display and leaks out.

If the light leaking to the side is allowed to contribute to the light emission, it is possible to enhance light extraction efficiency of the organic light emitting diode display.

SUMMARY

Embodiments of the present invention improve luminous efficiency of an organic light emitting diode display by allowing light, which is otherwise emitted from a light emitting layer of an organic light emitting diode display to the side thereof, thereafter leaking out and being extinguished, to instead be emitted to a light emitting surface of the organic light emitting diode display.

Specifically, embodiments of the present invention allow light, which is emitted from the light emitting layer of the organic light emitting diode display and incident on a pixel defining layer at the side of the light emitting layer, to be externally emitted without being extinguished in the pixel defining layer to thereby contribute to light emission by changing a path of the light.

To this end, embodiments of the present invention provide an organic light emitting diode display with enhanced luminous efficiency by forming pores in a pixel defining layer such that light incident on the pixel defining layer is scattered and emitted toward a light emitting surface.

An exemplary embodiment of the present invention provides an organic light emitting diode display including a substrate, first electrodes patterned on the substrate, pixel defining layers on the substrate to separate the first electrodes corresponding to pixel units, light emitting layers on the first electrodes and separated corresponding to the pixel units, and a second electrode on the light emitting layers, wherein the pixel defining layers have pores.

The pixel defining layer may include a light transmissive insulating polymer.

The light transmissive insulating polymer may include polyimide (PI).

A range of diameters of the pores may be about 10 nm to about 200 nm.

A ratio of a volume of the pores to a total volume of the pixel defining layer may be about 5% to about 50%.

The organic light emitting diode display may further include one or more first light emitting auxiliary layers between the light emitting layers and the first electrodes.

The first light emitting auxiliary layer may include at least one of a hole injection layer or a hole transporting layer.

The organic light emitting diode display may further include a second light emitting auxiliary layer between the light emitting layers and the second electrodes.

The second light emitting auxiliary layer may include at least one of an electron injection layer or an electron transporting layer.

The first electrode may be a positive electrode, and the second electrode may be a negative electrode.

Another exemplary embodiment of the present invention provides a method for manufacturing the organic light emitting diode display, the method including preparing a substrate, forming a pattern of first electrodes on the substrate, forming pixel defining layers between the patterned first electrodes, forming light emitting layers on the first electrodes, and forming a second electrode on the light emitting layers, wherein the forming of the pixel defining layers includes preparing a material for forming a pixel defining layer, coating the material for forming a pixel defining layer on the substrate and the first electrodes, patterning the coated material for forming a pixel defining layer to form pixel defining layers such that the first electrodes are partially exposed, and forming pores in the pixel defining layers.

The material for forming a pixel defining layer may include a light transmissive insulating polymer, a surfactant, and a solvent.

The light transmissive insulating polymer may include polyimide.

The surfactant may include NaDDBS.

The pores may be formed by processing the pixel defining layers with a solvent.

The pixel defining layers may be proccesed with the solvent by immersing the substrate with the pixel defining layers in the solvent.

The method may further include curing the pixel defining layers after the pores are formed.

The method may further include forming one or more first light emitting auxiliary layers before the light emitting layers are formed.

The first light emitting auxiliary layer may be formed by forming at least one of a hole injection layer or a hole transporting layer.

The method may further include forming one or more second light emitting auxiliary layers before the second electrode is formed and after the light emitting layers are formed.

The second light emitting auxiliary layer is formed by forming at least one of an electron transporting layer or an electron injection layer.

According to an exemplary embodiment of the present invention, in the organic light emitting diode display, since the pixel defining layer has the pores, light, which leaks to the side from the inside of the organic light emitting diode display, is extracted by a scattering effect, thereby increasing light efficiency.

Further, according to an exemplary embodiment of the present invention, a scattering layer may be formed without using a scattering agent in the pixel defining layer, such that light leaking to the side is extracted, thereby increasing light efficiency.

In addition, the organic light emitting diode display according to an exemplary embodiment of the present invention has a relatively simple structure and can improve luminance.

The foregoing summary is illustrative only, and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
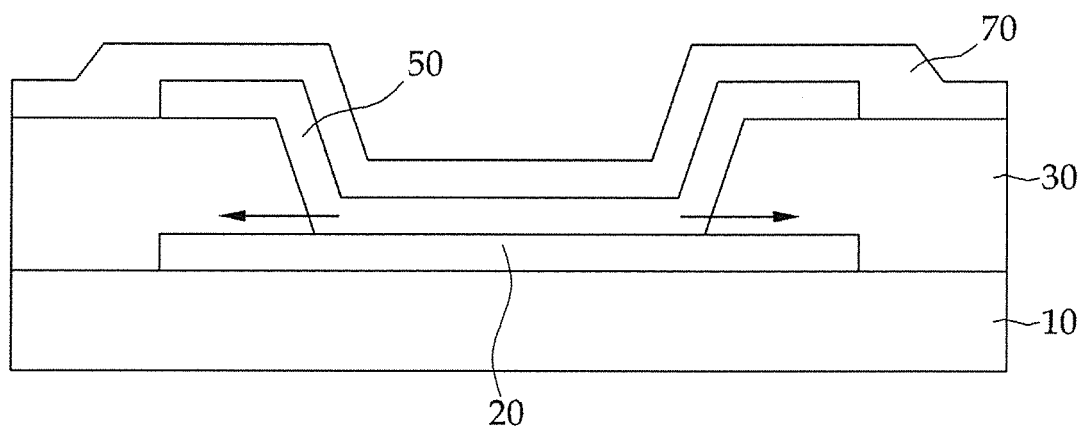
FIG. 1 illustrates a general structure of an OLED/pixel unit of an organic light emitting diode display in the related art, and illustrates a state in which light generated from a light emitting layer is emitted to a pixel defining layer and extinguished, the general direction of the light being indicated by arrows.

Hereinafter, exemplary embodiments of the present invention will be described in detail with reference to the accompanying drawings.

The present invention may be modified to be in various forms, and only specific exemplary embodiments are shown in the drawings and will be described representatively below. However, the scope of the present invention is not limited to the specific exemplary embodiments, and should be construed as including all the changes, equivalents, and substitutions included in the spirit and scope of the present invention.

Terms used herein are general terms that are widely used now. In some cases, however, terms selected at the applicant's discretion are also used, and the meanings thereof should be comprehended in consideration of meanings described or used in the detailed description of the invention.

In order to elucidate the present invention, parts that do not relate to the description may be omitted, and like reference numerals designate like elements throughout the specification. In the drawings, the size and the thickness of each element are arbitrarily represented for ease of description and the present invention is not limited to those shown in the drawings.

In the drawings, the thicknesses of layers, regions, etc., may be exaggerated for clarity and/or ease of description. It will be understood that when an element such as a layer, film, region, or substrate is referred to as being "on" another element, it can be directly on the other element, or intervening elements may also be present.

Figure 2:
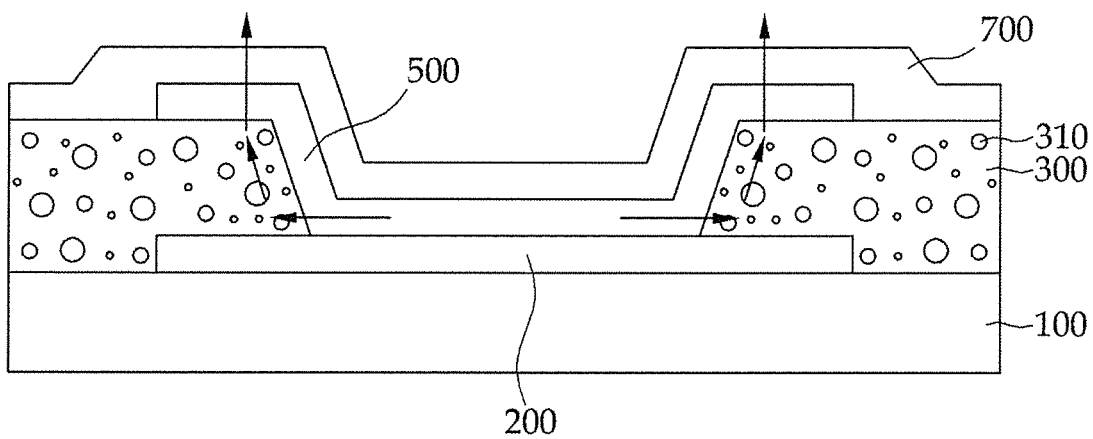
FIG. 2 schematically illustrates a structure of an OLED/pixel unit of an organic light emitting diode display according to an exemplary embodiment of the present invention, and illustrates a state in which light generated from a light emitting layer is emitted to a pixel defining layer and scattered to be emitted toward a light emitting surface.

FIG. 2 schematically illustrates a structure of an example of an OLED/pixel unit of an organic light emitting diode display according to an exemplary embodiment of the present invention. Herein, particularly, a pixel unit is restrictively and schematically illustrated for better understanding of the described embodiment of the present invention.

As shown in FIG. 2, the OLED/pixel unit of the organic light emitting diode display according to an exemplary embodiment of the present invention basically includes a substrate 100; a first electrode 200 patterned and formed on the substrate; pixel defining layers 300 formed on the substrate to divide the first electrode into pixel units; a light emitting layer 500 formed on the first electrode and divided corresponding to the pixel units; and a second electrode 700 formed on the light emitting layer.

As shown in FIG. 2, pores 310 are formed in the pixel defining layers 300 of the organic light emitting diode display according to embodiments of the present invention. The pores are generally filled with air. A refractive index of air is generally smaller than a refractive index of the pixel defining layer. Therefore, the pores filled with the air serve as light scattering particles to change a path of light that is incident on the pixel defining layer.

Arrows in FIG. 2 denote a path of light and show that the light, which is emitted from the light emitting layer and incident on the pixel defining layer 300, is refracted at the pores 310, such that the path is changed and the light is scattered toward a light emitting surface, thus contributing to light emission of the organic light emitting diode display. As described above, according to embodiments of the present invention, the pores 310 are formed in the pixel defining layer 300 of the organic light emitting diode display, thereby enhancing luminous efficiency of the organic light emitting diode display.

Hereinafter, the present embodiment of the present invention will be described based on the case where polyimide (PI) is used as a material for forming a pixel defining layer (e.g., PDL 300). A refractive index of polyimide (PI) as a material for forming the pixel defining layer 300 is 1.6 (n=1.6), and a refractive index of air is 1.0. Thus, a difference between the two refractive indices is about 0.6. When this difference is about 0.6, comparatively excellent light refracting and light scattering effects may be exhibited, and the pores 310 serve as refraction points. In this way, when the pores 310 are formed in the pixel defining layer 300, an effect equivalent to adding a light scattering agent to the pixel defining layer 300 may be achieved.

It is generally difficult to add the light scattering agent in a form of fine particles, while the pores may be formed in a size on the order of nanometers, and the light scattering agent has electric conductivity in many cases, while the air has an excellent electrical insulating property, and thus, is suitable for the pixel defining layer requiring an insulation property.

Sizes and density of the pores 310 formed in the pixel defining layer 300 may vary according to a size, a thickness, and a kind of the pixel defining layer 300.

In an exemplary embodiment of the present invention, a ratio of a volume of the pores 310 to a total volume of the pixel defining layer 300 may be 5% to 50%. In other words, the volume of the pores may be 5% to 50% of the total volume of the pixel defining layer. The volume ratio of the pores may be such that the ratio of the volume of the pores 310 to the total volume of the pixel defining layer 300 is 10% to 20%. The density of the pores (e.g., the number and size of the pores) may vary according to a material, a size, and a thickness of the pixel defining layer.

The sizes of the pores 310 may be represented by an average diameter, and the diameters of the pores 310 may be in a range of 10 to 200 nm. When the average diameter of the pores is less than 10 nm, effects due to the light refracting and scattering due to the pores may be reduced, and when the average diameter of the pores is more than 200 nm, the strength of the pixel defining layer may be reduced, which may be an obstacle to performing an intrinsic function of the pixel defining layer. Therefore, the average diameter of the pores 310 is limited as described above. A deviation in the diameters of individual pores from the average diameter may be possible. The average diameter of the pores of the present embodiment may be 100 to 200 nm.

In order to obtain the pores 310 of the pixel defining layer 300, a method of mixing the material for forming a pixel defining layer and a surfactant with a solvent to form a pixel defining layer, and then dissolving the surfactant by using a solvent that can dissolve the surfactant is used, thus forming the pores 310. In this case, the diameters and the volume of the pores 310 may be adjusted by a concentration of the surfactant to be mixed.

As described above, the light emitting layer 500 is formed on the pixel defining layer 300 with the pores 310, and the second electrode 700 is formed on the light emitting layer 500, thereby configuring the organic light emitting diode display.

FIGS. 3A to 3I schematically show an exemplary embodiment of a process for manufacturing an organic light emitting diode display according to the present invention.

Hereinafter, a method for manufacturing an organic light emitting diode display will be described, and respective constituent elements of the organic light emitting diode display will be described in more detail.

Figure 3A:
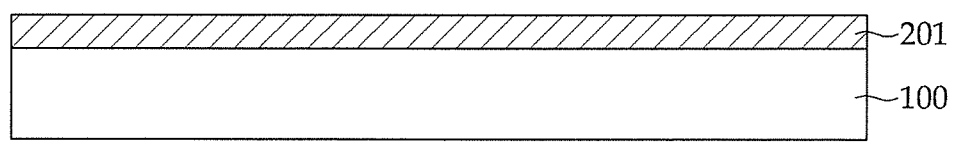
FIGS. 3A to 3I are cross-sectional views for describing a method for manufacturing an organic light emitting diode display according to an exemplary embodiment of the present invention.

First, a substrate 100 is prepared and a material 201 for forming a first electrode is coated on the substrate (FIG. 3A).

The process of preparing the substrate may include preparing the substrate, forming a TFT layer, and forming an insulating and planarizing layer. In the present exemplary embodiment, a description of these processes is omitted. The substrate may be selected and used from those generally used in the art. For example, a glass substrate or a plastic substrate may be used.

As a method of coating the material 201 for forming a first electrode, a method which is generally used in the art may be applied. An example of the method includes a sputtering method, although methods other than the sputtering method may also be applied.

The first electrode 200 may include at least one of a transparent conductive oxide (TCO) layer and a metal layer. Therefore, the process of coating the material 201 for forming a first electrode so as to form the first electrode 200 may include at least one of forming a transparent conductive oxide (TCO) layer and forming a metal layer. Herein, the transparent conductive oxide (TCO) layer may include at least one of an ITO layer, an IZO layer, and an AZO layer. The metal layer may include at least one of a silver (Ag) layer, a copper (Cu) layer, and an aluminum (Al) layer.

Meanwhile, the first electrode 200 may have a structure in which an ITO layer, a silver (Ag) layer, and an ITO layer are sequentially stacked, such as by forming the ITO layer, forming the silver (Ag) layer, and forming the ITO layer in sequence.

Figure 3B:
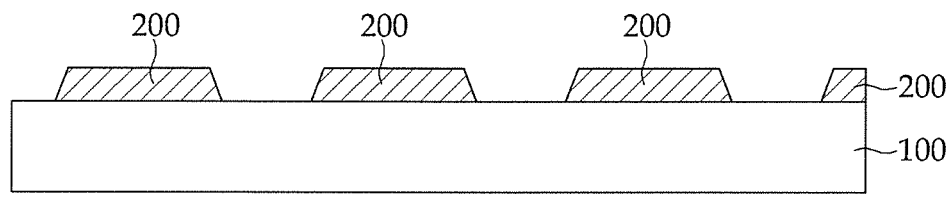

The first electrodes 200 are formed by patterning the material 201 for forming a first electrode that is coated on the substrate 100 (FIG. 3B). As a patterning method, a method which is generally used in the art may be applied.

Figure 3C:
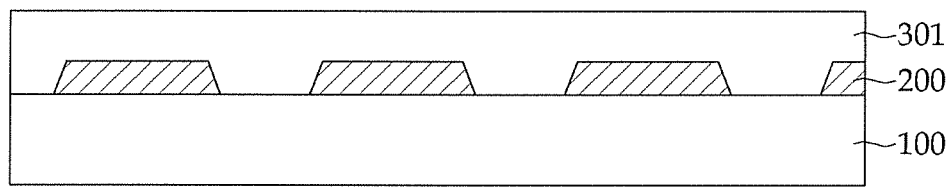

A material 301 for forming a pixel defining layer is coated on the patterned first electrodes 200 and the substrate 100 (FIG. 3C).

The material 301 for forming a pixel defining layer is prepared by mixing a light transmitting insulating polymer as a material of a pixel defining layer, a surfactant, and a solvent at a predetermined ratio. Other materials required for forming a pixel defining layer may be further included. In an exemplary embodiment, the surfactant is included such that a weight of the surfactant is 5% to 50% of a total weight of the light transmitting insulating polymer and the surfactant (e.g., [surfactant/(light transmitting insulating polymer+surfactant)]).

In this case, a kind of light transmitting insulating polymer is not particularly limited. In the present exemplary embodiment, the case where polyimide (PI) is used as the light transmitting insulating polymer is described as an example. As the surfactant, NaDDBS and the like, which are dissolved in water or an organic solvent, may be used. In the present exemplary embodiment, polyimide (PI) mixed with NaDDBS and toluene is used.

Figure 3D:
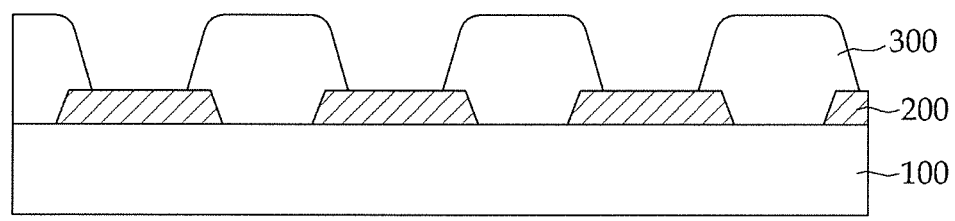

Pixel defining layers 300 are formed by patterning the coated material 301 for forming a pixel defining layer (FIG. 3D). As the patterning method, a method which is generally used in the art may be applied.

The pixel defining layers 300 are formed between the first electrodes 200 such that top portions of the first electrodes 200 are exposed.

In this regard, FIG. 3D shows a state where the pixel defining layers 300 are formed between the first electrodes 200. Herein, the top portions of the first electrodes are partially opened.

Figure 3E:
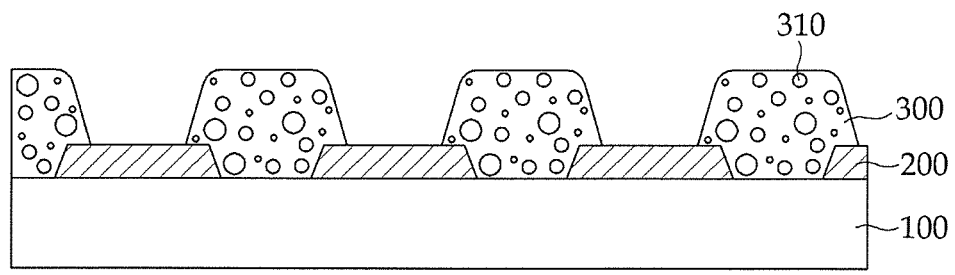

Pores 310 are formed in the pixel defining layers 300 (FIG. 3E). The forming of the pores 310 includes processing the pixel defining layers 300 with a solvent. As an example of the method, a method of immersing the substrate 100 with the pixel defining layers 300 in a solvent may be used. In this case, the solvent is not limited if the solvent can dissolve the surfactant used in the material 301 forming a pixel defining layer, and water may be used.

As described above, the surfactant is dissolved by water in the pixel defining layers 300, such that the pores 310 are formed at locations where the surfactant was present in the pixel defining layers 300. Therefore, the volume and the diameters of the pores 310 may be adjusted by a concentration of the surfactant that is mixed in the material 301 for forming a pixel defining layer.

In the present exemplary embodiment, the volume of the pores 310 may be 5% to 50% of the total volume of the pixel defining layers 300. In the present exemplary embodiment, the volume of the pores is in a range of 10% to 20%. The diameters of the pores 310 may be 10 to 200 nm. In the present exemplary embodiment, the average diameter of the pores 310 is 100 to 200 nm. The density (volume ratio) and the average diameter of the pores may be adjusted by adjusting the content of the surfactant.

Herein, when the average diameter of the pores is less than 10 nm, it is difficult to expect a scattering effect due to the pores. When the average diameter is more than 200 nm, the integrity of the pixel defining layer may be weakened, which may make it difficult to perform an intrinsic function of the pixel defining layer.

Next, the method for manufacturing an organic light emitting display device may include curing the pixel defining layers 300 to perform subsequent steps, such as forming light emitting layers on the pixel defining layers 300 with the pores 310. A curing method may include heat treatment and the like.

Figure 3F:
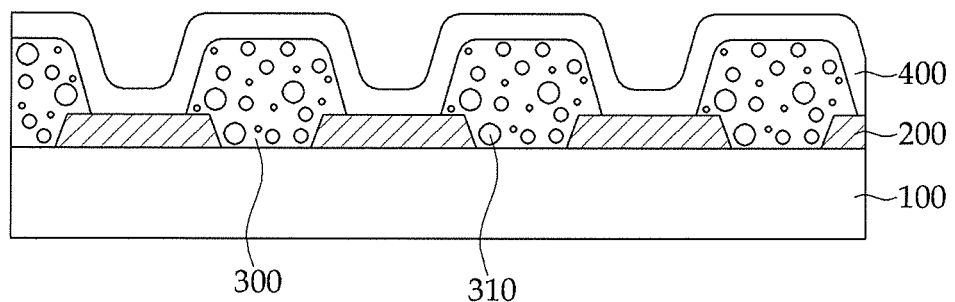

Referring to FIG. 3F, in the process according the present exemplary embodiment, a first light emitting auxiliary layer 400 is formed before forming light emitting layers. The first light emitting auxiliary layer 400 is formed over the entire surface of the top portions of the first electrode 200 and the pixel defining layers 300. The first light emitting auxiliary layer 400 may include any one of a hole injection layer and a hole transporting layer or both the hole injection layer and the hole transporting layer.

FIG. 3F illustrates that a hole injection and transporting layer having both a hole injection function and a hole transporting function is formed in one layer. For reference, the forming of the first light emitting auxiliary layer 400 may include any one of forming a hole injection layer and forming a hole transporting layer, or may include both steps.

For example, the first light emitting auxiliary layer 400 may include two layers such that a hole injection layer may be formed, and thereafter, a hole transporting layer may be formed.

Figure 3G:
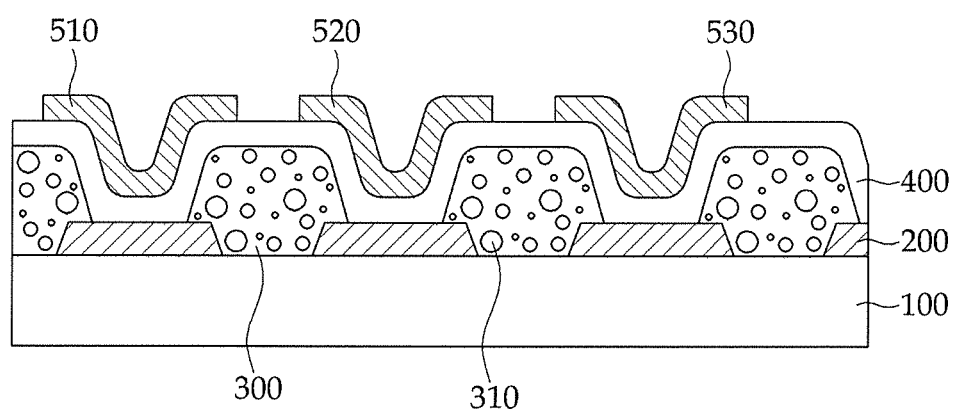

Subsequently, light emitting layers 510, 520, and 530 are formed on the first light emitting auxiliary layer 400 (FIG. 3G). The light emitting layers 510, 520, and 530 are positioned above the first electrodes 200 comprising the pixel units that are separated by the pixel defining layers 300.

Figure 3H:
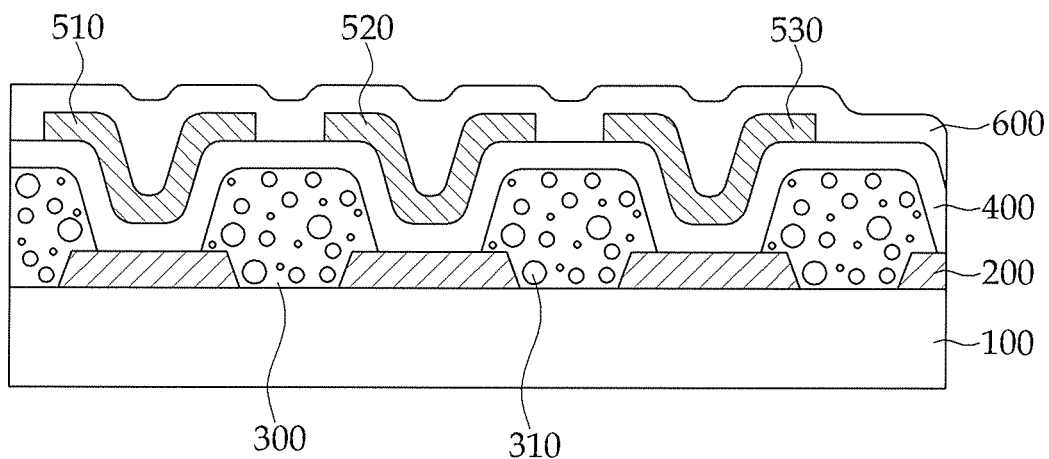
Figure 3I:
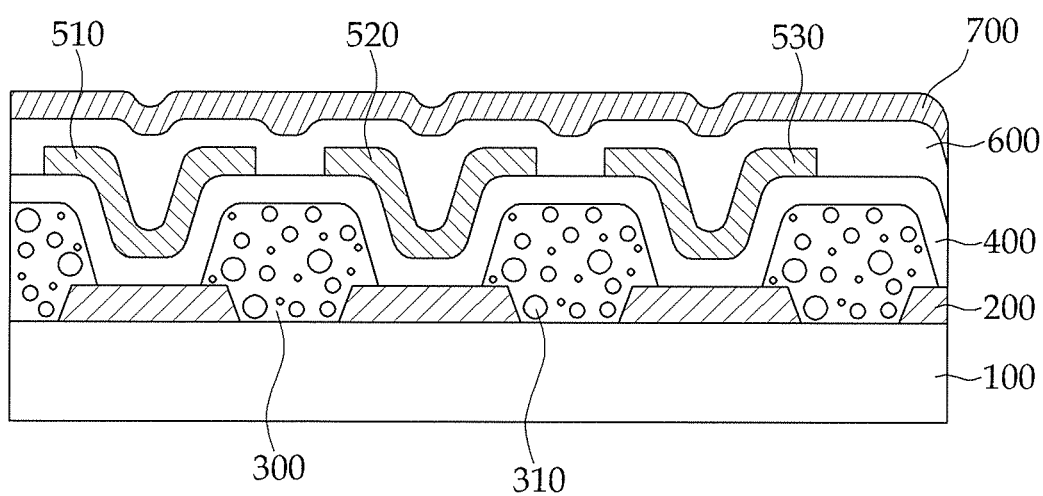

Referring to FIGS. 3H and 3I, in the process according to the present exemplary embodiment, after forming the light emitting layers, a second light emitting auxiliary layer 600 is formed before forming a second electrode 700.

The second light emitting auxiliary layer 600 may include at least one of an electron injection layer and an electron transporting layer. Therefore, the forming of the second light emitting auxiliary layer may include at least one of forming an electron transporting layer; and forming an electron injection layer.

In the present exemplary embodiment, for example, the second light emitting auxiliary layer 600 is an electron transporting layer. Therefore, in FIG. 3H, an electron transporting layer is formed as the second light emitting auxiliary layer 600. The second light emitting auxiliary layer 600 may include two layers so as to separately include both the electron injection layer and the electron transporting layer.

Thereafter, a second electrode 700 is formed on the second light emitting auxiliary layer 600 (FIG. 3I).

The organic light emitting diode display according to the present invention may be manufactured through the aforementioned processes.

Another exemplary embodiment of the present invention provides a method for manufacturing an organic light emitting diode display, the method including preparing a substrate, forming a pattern of first electrodes on the substrate, preparing a material for forming a pixel defining layer; coating the material for forming a pixel defining layer on the substrate and the first electrodes, patterning the coated material for forming a pixel defining layer to form pixel defining layers such that the first electrodes are partially exposed, processing the pixel defining layers with water to form pores, curing the pixel defining layers after forming the pores, forming light emitting layers on the first electrodes, and forming a second electrode on the light emitting layers.

The organic light emitting diode display according to exemplary embodiments of the present invention can maintain the intrinsic function of the pixel defining layer without using a separate scattering agent. Therefore, the organic light emitting diode display may have a simple configuration compared to an organic light emitting diode display in the related art which introduces a scattering agent or a polarizing plate in a pixel defining layer, and can ensure improved light efficiency and luminance by a scattering effect.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims, and their equivalents.

What is claimed is:

1. An organic light emitting diode display, comprising:
   a substrate;
   first electrodes patterned on the substrate;
   pixel defining layers on the substrate to separate the first electrodes corresponding to pixel units;
   light emitting layers on the first electrodes and separated corresponding to the pixel units; and
   a second electrode on the light emitting layers,
   wherein the pixel defining layers have pores, the pixel defining layers being in contact with the first electrodes.

2. The organic light emitting diode display of claim 1, wherein the pixel defining layer comprises a light transmissive insulating polymer.

3. The organic light emitting diode display of claim 2, wherein the light transmissive insulating polymer comprises polyimide (PI).

4. The organic light emitting diode display of claim 1, wherein a range of diameters of the pores is about 10 nm to about 200 nm.

5. The organic light emitting diode display of claim 1, wherein a ratio of a volume of the pores to a total volume of the pixel defining layer is about 5% to about 50%.

6. The organic light emitting diode display of claim 1, further comprising one or more first light emitting auxiliary layers between the light emitting layers and the first electrodes.

7. The organic light emitting diode display of claim 6, wherein the first light emitting auxiliary layer comprises at least one of a hole injection layer or a hole transporting layer.

8. The organic light emitting diode display of claim 1, further comprising a second light emitting auxiliary layer between the light emitting layers and the second electrodes.

9. The organic light emitting diode display of claim 8, wherein the second light emitting auxiliary layer comprises at least one of an electron injection layer or an electron transporting layer.

10. The organic light emitting diode display of claim 1, wherein the first electrode is a positive electrode, and
wherein the second electrode is a negative electrode.

11. The organic light emitting diode display of claim 1, wherein the pixel defining layers are in contact with one of a first light emitting auxiliary layer or light emitting layers.

* * * * *